(12) United States Patent
Oomiya et al.

(10) Patent No.: US 6,506,675 B1
(45) Date of Patent: Jan. 14, 2003

(54) COPPER FILM SELECTIVE FORMATION METHOD

(75) Inventors: Kayoko Oomiya, Yokohama (JP); Keiji Suzuki, Yokohama (JP); Keisaku Yamada, Fukaya (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 62 days.

(21) Appl. No.: 09/612,237

(22) Filed: Jul. 7, 2000

(30) Foreign Application Priority Data

| Jul. 9, 1999 | (JP) | 11-196205 |
| Jul. 9, 1999 | (JP) | 11-196208 |
| Jul. 16, 1999 | (JP) | 11-203052 |

(51) Int. Cl.[7] .............................. H01L 21/44
(52) U.S. Cl. .................. 438/677; 438/674; 438/676; 438/654; 438/628
(58) Field of Search ............... 438/674, 677, 438/675, 680, 681, 628, 654, 676

(56) References Cited

U.S. PATENT DOCUMENTS

| 5,140,396 A | * | 8/1992 | Needham et al. ............ 257/294 |
| 5,773,366 A | * | 6/1998 | Hwang ......................... 438/718 |
| 5,817,572 A | * | 10/1998 | Chiang et al. .............. 438/624 |
| 5,830,533 A | * | 11/1998 | Lin et al. .................... 427/272 |
| 6,057,240 A | * | 5/2000 | Zhou et al. ................. 438/689 |
| 6,143,644 A | * | 11/2000 | Chen et al. ................. 438/622 |
| 6,180,519 B1 | * | 1/2001 | Kuroi et al. ................ 438/649 |
| 6,274,932 B1 | * | 8/2001 | Mikagi ........................ 257/754 |

FOREIGN PATENT DOCUMENTS

| JP | 3-236237 | 10/1991 |
| JP | 6-326104 | 11/1994 |

OTHER PUBLICATIONS

Wolf, S. and Tauber, R.N., "Silicon Processing for the VLSI Era", vol. 1, pp. 420–421, 1986.*

* cited by examiner

Primary Examiner—Carl Whitehead, Jr.
Assistant Examiner—Christy Novacek
(74) Attorney, Agent, or Firm—Pillsbury Winthrop LLP

(57) ABSTRACT

Disclosed is a copper film selective formation method capable of reducing the material cost by selectively depositing copper in a necessary region of an undercoat film made of an arbitrary material such as a metal or an insulating material. This copper film selective formation method includes the steps of forming a thin film of a silane coupling agent or a surfactant on an undercoat film on a substrate, making a prospective copper film region of the thin film hydrophilic, and selectively forming a copper film in the hydrophilic prospective copper film region of the undercoat film by CVD of copper.

6 Claims, 10 Drawing Sheets

COPPER FILM SELECTIVE FORMATION METHOD

CROSS-REFERENCE TO RELATED APPLICATIONS

This application is based upon and claims the benefit of priority from the prior Japanese Patent Applications No. 11-196205, filed Jul. 9, 1999; No. 11-196208, filed Jul. 9, 1999; and No. 11-203052, filed Jul. 16, 1999, the entire contents of which are incorporated herein by reference.

BACKGROUND OF THE INVENTION

The present invention relates to a method of selectively forming a copper film used as an interconnect material in an LSI or a liquid crystal display.

Aluminum (Al) is mainly used as an interconnect material in an LSI or a liquid crystal display. However, since Al has a higher resistance than that of copper (Cu), an Al interconnection delays signals and increases consumption power by heat generation. Therefore, Cu is attracting attention as an interconnect material of the next generation.

A Cu interconnection has been realized only by dry etching in a high-temperature atmosphere and hence is impractical at present. Although Cu can also be processed by wet etching, no microfabrication is possible.

As described above, a Cu interconnection is difficult to form by etching, so in the fabrication of an LSI the formation of Cu interconnection by CMP (Chemical Mechanical Polishing) is partially put into practical use.

Unfortunately, when CMP is applied to the formation of interconnecting lines in a liquid crystal display, it is practically difficult to form Cu interconnectins by CMP because the substrate of a liquid crystal display has a large area. Also, even when etching or CMP of Cu is possible in a liquid crystal display, the total area of Cu interconnections is smaller than the area of a glass substrate, so most of Cu films formed on this glass substrate are removed when Cu interconnections are formed. This significantly lowers the use efficiency of Cu that is an expensive material. That is, most of Cu films formed are wasted, and the price of a liquid crystal display increases.

BRIEF SUMMARY OF THE INVENTION

It is an object of the present invention to provide a copper film selective formation method capable of reducing the material cost by selectively depositing copper in a necessary region of an undercoat film made of an arbitrary material such as a metal or an insulating material.

According to the present invention, there is provided a copper film selective formation method comprising the steps of:

forming a thin film made of a hydrophobic material on an undercoat film on a substrate;

making a prospective copper film region of the thin film hydrophilic; and selectively forming a copper film in the hydrophilic prospective copper film region of the undercoat film by CVD of copper.

Also, according to the present invention, there is provided a copper film selective formation method comprising the steps of:

forming a thin film having a hydrophobic surface on an undercoat film on a substrate;

selectively forming an opening in a prospective copper film region of the thin film;

depositing a copper film primarily on the undercoat film exposed in the opening of the thin film by CVD of copper; and removing the thin film.

Furthermore, according to the present invention, there is provided a copper film selective formation method comprising the steps of:

forming an undercoat film on a substrate;

forming a conductor pattern on the surface of the undercoat film, the conductor pattern being made of a material other than copper and having higher conductivity than that of the undercoat film; and selectively depositing a copper film on the conductor pattern by CVD of copper.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
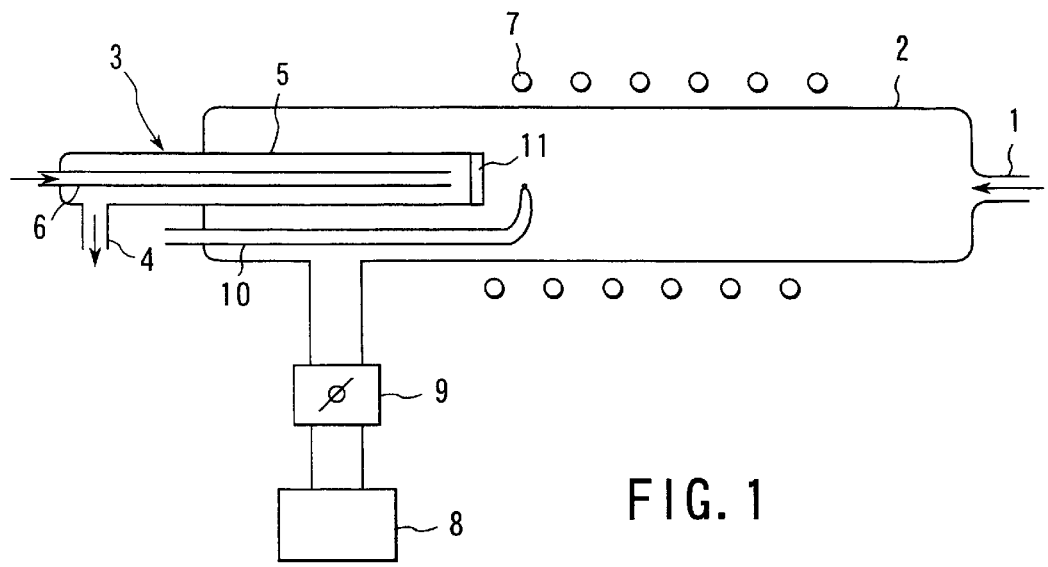
FIG. 1 is a schematic view showing a low-pressure CVD apparatus used in the selective formation of a thin Cu film in the present invention.

A copper film selective formation method according to the present invention will be described in detail below.

(First Step)

First, a thin film made from a silane coupling agent or a surfactant is formed on the surface of an undercoat film on a substrate.

As this substrate, it is possible to use, e.g., a silicon substrate, a compound semiconductor substrate, or a glass substrate.

The undercoat film is made of an arbitrary material, e.g., an insulator such as single-crystal silicon, polysilicon, amorphous silicon, silicon oxide, or silicon nitride, or a metal such as Cu or Ti.

Examples of the silane coupling agent are hexamethyldisilazane, vinyltrichlorosilane, vinyltrimethoxysilane, vinyltriethoxysilane, vinyltris(β-methoxyethoxy)silane, γ-glycidoxypropyltrimethoxysilane, γ-methacryloxypropylmethyldimethoxysilane, N-β(aminoethyl) γ-aminopropylmethyldimethoxysilane, γ-mercaptopropyltrimethoxysilane, γ-aminopropyltriethoxysilane, and bis(3-triethoxysilylpropyl)tetrasulfane.

As the surfactant, long-chain alkylsulfonic acid, long-chain alkylcarboxylic acid, or the like can be used.

A thin film made from the silane coupling agent or the surfactant described above is formed by, e.g., vapor adsorption or coating. This thin film preferably has a molecular-level thickness since it is removed by decomposition by ultraviolet light irradiation (to be described later).

(Second Step)

Subsequently, a prospective copper film region of the thin film made from the silane coupling agent or the surfactant is made hydrophilic.

To make the prospective copper film region of the thin film hydrophilic, it is possible to use, e.g., a method of selectively irradiating this prospective copper film region of the thin film with ultraviolet light (UV light).

When the wavelength of this UV light is 365 nm, the film is preferably selectively irradiated with an output of 300 mJ/cm$^2$ or more.

(Third Step)

CVD of copper is performed to selectively deposit a copper film in the hydrophilic prospective copper film region of the undercoat film.

As a source gas of this CVD of copper, it is possible to use, e.g., trimethylvinylsilane-added hexafluoroacetylacenate copper, trimethylphosphine-added hexafluoroacetylacenate copper, or 1,5-cyclooctadiene-added hexafluoroacetylacenate copper. This source gas can be diluted by a carrier gas such as nitrogen.

In this CVD of copper, the source gas of copper described above is desirably decomposed by adsorption by setting the ambient temperature (e.g., the substrate temperature) of the substrate to preferably 220° C. or less, and more preferably, 150 to 200° C.

As described above, a thin film made from a silane coupling agent or a surfactant is formed on an undercoat film on a substrate. A prospective copper film region of this thin film is selectively irradiated with UV light to make the irradiated region hydrophilic. This processing produces a hydrophobic/hydrophilic difference on the surface of the undercoat film. In this state, CVD of copper (adsorptive decomposition of a source gas of copper) is performed at a low temperature such as 150 to 220° C. As a consequence, copper is selectively deposited in the hydrophilic region (prospective copper film region) to form a copper film (copper pattern) such as a copper interconnection.

That is, the present inventors performed CVD by using trimethylvinylsilane-added hexafluoroacetylacenate copper as a source gas of copper in a CVD apparatus for evaluating, which has a structure shown in FIG. 1, by setting the ambient temperature of a substrate, e.g., a substrate temperature to 150 to 220° C. Consequently, the decomposition rate was such that decomposition of the source gas in a vapor phase did not occur or was almost negligible.

This CVD apparatus includes a quartz reaction tube 2 having an inside diameter of 50 mm and having a source gas supply pipe 1 at one end (right-hand end). A substrate holder 3 is inserted into this reaction tube 2 from an end portion (left-hand end) away from the end portion connected to the supply pipe 1. This holder 3 is composed of a housing 5 and a cooling water supply pipe 6. The front end face of the housing 5 functions as a substrate holding portion, and cooling water is circulated inside the housing 5. This housing 5 has a cooling water discharge portion 4 in a side wall positioned outside the reaction tube 2. The cooling water supply pipe 6 is inserted from the rear end portion of the housing 5 and supplies cooling water. A heater 7 is wound around the outer circumferential surface of the reaction tube 2 over a length of about 1 m from the vicinity of the front end of the substrate holder 3 toward the source gas supply pipe 1. A vacuum pump 8 is connected, via a variable valve 9, to the vicinity of the end portion of the reaction tube 2 away from the end portion connected to the gas supply pipe 1. A sealed pipe 10 having a thermocouple is inserted into the reaction tube 2 from the end portion of the reaction tube 2 away from the end portion connected to the gas supply pipe 1 such that the end portion of this sealed pipe 10 is close to the front end face of the holder 3.

In this CVD apparatus shown in FIG. 1, a substrate 11 made of a desired material was held on the front end face of the substrate holder 3. Cooling water was supplied into the housing 5 through the cooling water supply pipe 6 and discharged from the discharge portion 4, thereby cooling the substrate 11 held on the front end face of the substrate holder 3. Subsequently, trimethylvinylsilane-added hexafluoroacetylacenate copper as a source gas of copper was supplied into the reaction tube 1 through the gas supply pipe 1. Simultaneously, the vacuum pump 8 was operated to exhaust the gas in the reaction tube 2 through the variable valve 9. This exhaustion was so controlled by the variable valve 9 that the pressure in the reaction tube 2 was 100 Pa and the flow rate in the gas supply pipe 1 was 8 cm/sec. When the vacuum exhaustion stabilized, the heater 7 was powered to heat the source gas supplied from the gas supply pipe 1. The thermocouple of the sealed pipe 10 was used to detect that the source gas was heated. It may be necessary to heat, not to cool, the substrate in order to set the temperature at the circumferential surface of the substrate (e.g., the temperature of the substrate) at 150° C. to 220° C. In this case, means for heating the substrate may be provided.

Under the above conditions, cooling of the substrate by the substrate holder and the temperature of heating by the heater 7 were controlled such that the temperature measured by the thermocouple of the sealed pipe 10 varied. In this manner, the relationship between the temperature of a 24 hr film formation operation and the deposited film thickness of Cu was obtained. The result is shown in FIG. 2.

Figure 2:
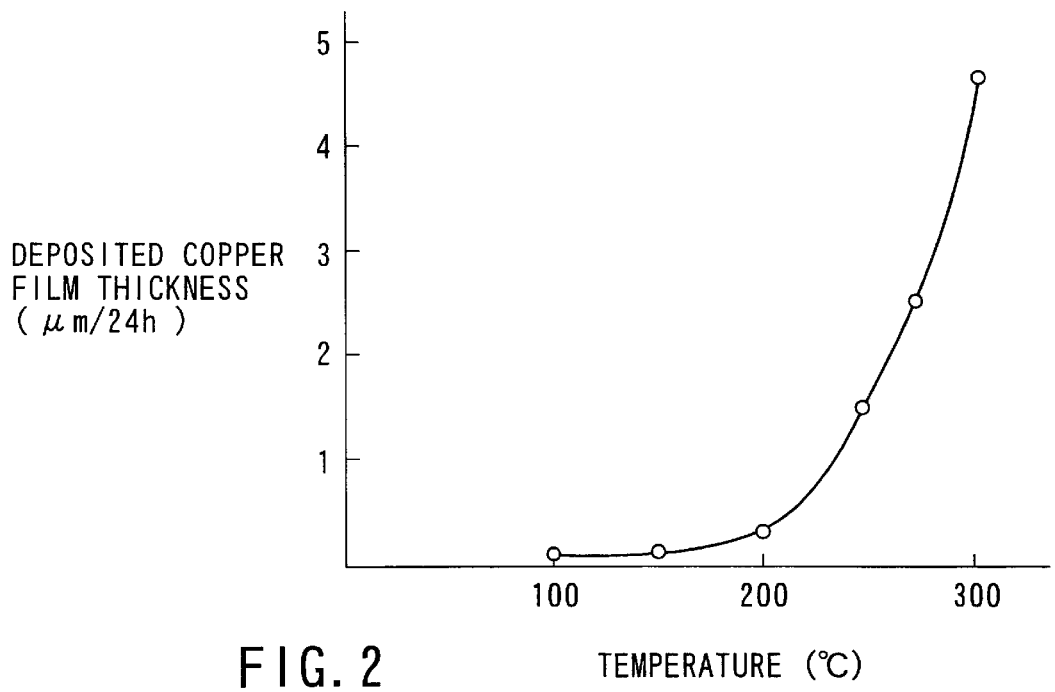
FIG. 2 is a graph showing the relationship between the temperature and the deposited Cu film thickness when a thin Cu film is deposited by the low-pressure CVD apparatus shown in FIG. 1.

FIG. 2 shows that no significant Cu deposition was found when the ambient temperature measured by the thermocouple near the substrate was 200° C. or less. This fact implies that when the Cu decomposition temperature is 200° C. (220° C. or less in some instances), no source gas decomposition occurs in a vapor phase, and the reaction is exclusively adsorptive decomposition on the surface of a substrate. Accordingly, under this condition Cu is selectively deposited; Cu is deposited in a hydrophilic portion which adsorbs a source gas and is not deposited in a hydrophobic portion which inhibits adsorption of the source gas.

A single-crystal silicon substrate, a polysilicon substrate, an amorphous silicon substrate, and a single-crystal silicon substrate having a surface covered with an SiO film were allowed to adsorb saturated vapor of a silane coupling agent (e.g., hexamethyldisilazane) at room temperature (25° C.) for about 5 min. Note that the length of this adsorption time has no particular influence on the characteristics after that. Subsequently, each surface on which the silane coupling agent was adsorbed was irradiated with 365 nm UV light at an output of 1,500 mJ/cm$^2$. An XPS analysis indicated that after the irradiation the coupling agent changed such that Si—O bonds were dominant in it.

Each of the substrates not processed by the silane coupling agent, the substrates processed by the silane coupling agent, and the substrates irradiated with the UV light was held on the substrate holder shown in FIG. 1 described above. Trimethylvinylsilane-added hexafluoroacetylacenate copper as a source gas of copper was used to deposit a Cu film by CVD at 150° C. and a source gas pressure of 1 torr.

Figure 3:
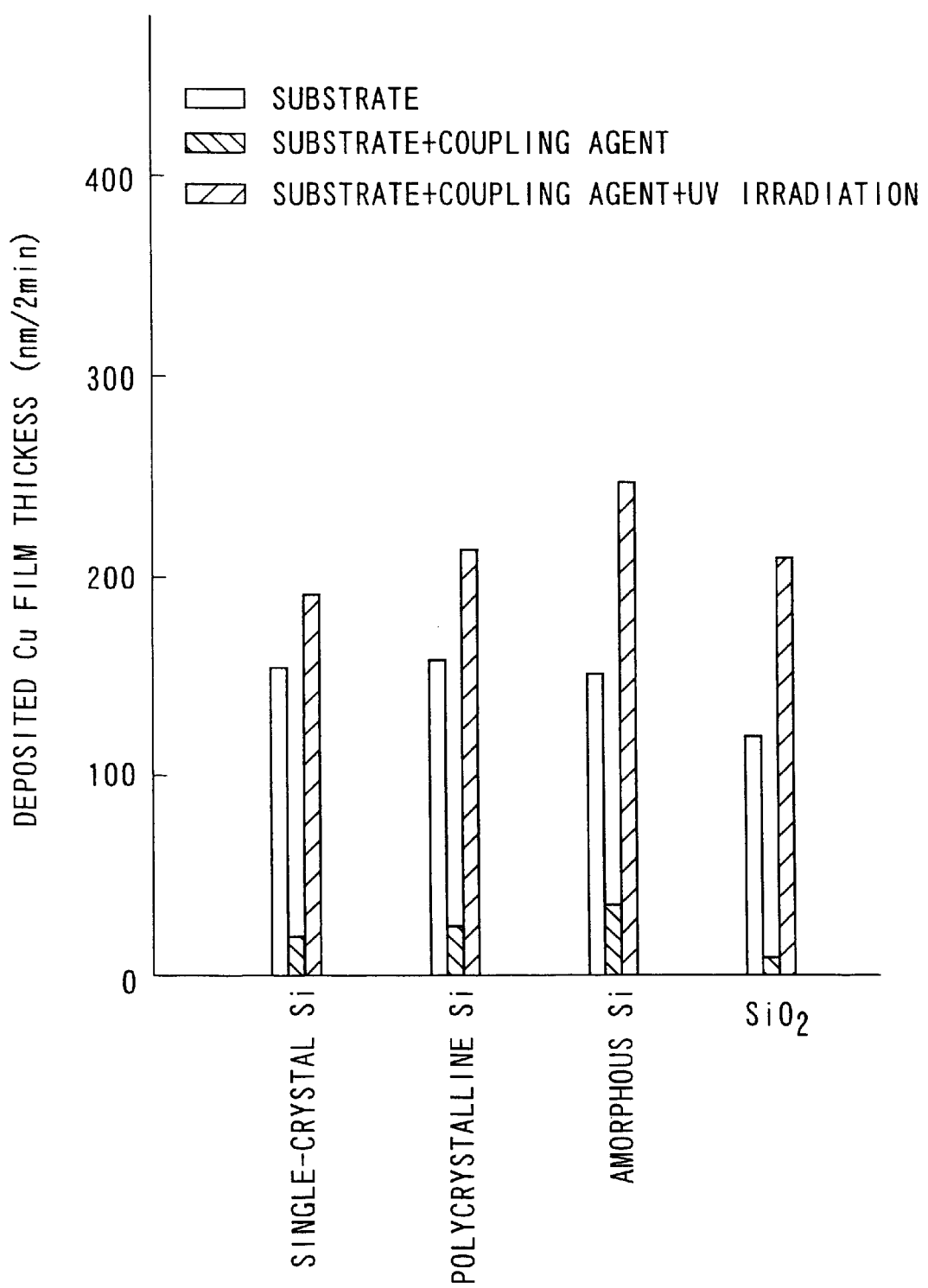
FIG. 3 is a graph showing the deposited Cu film thicknesses on various substrates, various substrates having surfaces on which a silane coupling agent is vapor-deposited, and various substrates having surfaces on which a silane coupling agent is vapor-deposited and irradiated with ultraviolet light.

FIG. 3 shows the thickness of a Cu film on each substrate by CVD for two minutes. FIG. 3 implies an important process advantage: a large Cu film thickness difference is produced between the surface on which a silane coupling agent is adsorbed and the surface irradiated with UV light regardless of the material of an undercoat film, and only UV irradiation controls the vapor deposition region.

As described above, in the present invention a thin film of a silane coupling agent or a surfactant is formed on the surface of an undercoat film on a substrate. A prospective copper film region of this thin film is irradiated with UV light to make this region hydrophilic. After that, CVD of copper (adsorptive decomposition of a source gas of copper) is performed at a low temperature of 150 to 220° C., thereby selectively depositing the copper in the hydrophilic region (prospective copper film region). Consequently, a copper film (copper pattern) such as a copper interconnection can be selectively formed in the desired region of the undercoat film without wasting copper unlike in etching or CMP.

Another copper film selective formation method according to the present invention will be described below.
(First Step)
First, a thin film having a hydrophobic surface is formed on the surface of an undercoat film on a substrate. Subsequently, a hole is formed in a prospective copper film region of this thin film.

As the substrate, it is possible to use, e.g., a silicon substrate, a compound semiconductor substrate, or a glass substrate.

The undercoat film is made of an arbitrary material, e.g., an insulator such as single-crystal silicon, polysilicon, amorphous silicon, silicon oxide, or silicon nitride, or a conductive material containing a metal selected from Cu, Ti, TaN, TaNb, W, WN, TiN, TaSiN, Ta, Co, Zr, ZrN, and CuTa. To prevent the diffusion of copper from a copper wiring layer formed by selective deposition (to be described later) of copper, it is particularly preferable to use a copper diffusion preventing conductive material selected from TiN, TaNb, W, WN, TaN, TaSiN, Ta, Zr, ZrN, and CuTa as the conductive material described above. The undercoat film made of this copper diffusion preventing conductive material preferably has a thickness of 15 to 50 nm.

A photosensitive resin layer is an example of the thin film having a hydrophobic surface. As this photosensitive resin, either a positive type or negative type resin can be used. Practical examples are a cresol novolak resist and an acrylic resin-based resist. A hole can be formed in the prospective copper film region of this photosensitive resin layer by using a method of performing selective exposure and development.

The thickness of the thin film (particularly the photosensitive resin layer) is preferably 0.3 μm or more, and more preferably, 0.7 to 1.5 μm, in order to improve the separation between the undercoat and a Cu film formed by depositing Cu on the photosensitive resin layer by CVD (to be described later).

Note that the photosensitive resin layer can be exposed to a plasma of $O_2$ gas or of a gas mixture containing $O_2$ gas. This gas mixture can be a mixture of $CF_4$ and $O_2$. To prevent a film reduction of the photosensitive resin layer by ashing, the plasma exposure time is preferably 1 min or less. The photosensitive resin layer can also be exposed to one or both of ozone gas and ultraviolet radiation, instead of a plasma.
(Second Step)
Subsequently, CVD of copper is performed to selectively deposit a copper film primarily in the portion (prospective copper film region) of the undercoat film exposed in the hole in the photosensitive resin layer. After that, the photosensitive resin layer is removed to form a copper film (e.g., a copper interconnection) on the undercoat film.

A source gas of the CVD of copper can be the same as used in the copper selective formation methods described above. This source gas can be diluted by a carrier gas such as nitrogen.

In this CVD of copper, the source gas of copper described above is desirably decomposed by adsorption by setting the ambient temperature (e.g., the substrate temperature) of the substrate to preferably 220° C. or less, and more preferably, 150 to 200° C.

In this copper film selective formation method according to the present invention as described above, a thin film having a hydrophobic surface such as a photosensitive resin layer is formed on an undercoat film. This photosensitive resin layer is exposed and developed to form a hole in a prospective copper film region. Since a photosensitive resin is usually hydrophobic, a hydrophilic/hydrophobic difference is produced between the undercoat film exposed in the hole and the photosensitive resin layer. In this state, CVD of copper is performed at a low temperature of 150 to 220° C. As described above, this CVD is performed by adsorptive decomposition of a source gas of copper. Hence, copper can be selectively deposited in the region (prospective copper film region) of the hydrophilic undercoat film exposed in the hole in the photosensitive layer. Even if copper is slightly deposited on the photosensitive resin layer, a copper film (e.g., a copper line) faithful to the hole pattern in the photosensitive resin layer can be formed by so-called liftoff for removing this photosensitive resin layer. Consequently, a copper film (copper pattern) such as a copper line can be selectively formed in the desired region of the undercoat film without wasting copper unlike in etching or CMP.

Also, since the exposed photosensitive resin layer is exposed to a plasma of $O_2$ gas or of a gas mixture containing $O_2$ gas, a ring of the photosensitive resin layer located in the vicinity of the hole after the development can be completely removed. In this state, CVD of copper (adsorptive decomposition of a source gas of copper) is performed at a low temperature of 150 to 220° C. This allows the copper to be selectively deposited only in the portion (prospective copper film region) of the hydrophilic undercoat film exposed in the hole in the photosensitive resin layer. By removing this photosensitive resin layer after the CVD of copper, a copper film faithful to the shape of the hole can be selectively formed in the predetermined undercoat region.

Still another copper film selective formation method according to the present invention will be described in detail below.

(First Step)

First, a conductor pattern is formed in a prospective copper film region on the surface of an undercoat film on a substrate. This conductor pattern is made of a material other than copper and has higher conductivity than that of the undercoat film.

As the substrate, it is possible to use, e.g., a silicon substrate, a compound semiconductor substrate, or a glass substrate.

The undercoat film is made of an arbitrary material, e.g., an insulator such as single-crystal silicon, polysilicon, amorphous silicon, silicon oxide, or silicon nitride, or a metal.

The conductor pattern is selected from a material having higher conductivity than that of the undercoat film. Examples are Ti, W, Mo, Ta, Al, alloys of these metals, an alloy selected from TiN, TaNb, WN, Tan, TaSiN, Ta, Zr, ZrN, and CuTa, and amorphous silicon or polysilicon containing $5 \times 10^{18}$ particles/cm$^2$ of an n- or p-type dopant. To prevent the diffusion of copper from a copper wiring layer formed by selective deposition (to be described later) of copper, it is preferable to use a copper diffusion preventing conductive material selected from TiN, TaNb, W, WN, TaN, TaSiN, Ta, Zr, ZrN, and CuTa as the conductive material described above.

The conductor pattern preferably has a thickness of 0.01 to 0.2 $\mu$m.

This conductor pattern is formed as follows. For example, a thin film of the abovementioned material is formed on the undercoat film by vacuum vapor deposition, sputtering, CVD, or plating. After that, a resist pattern is formed in a prospective copper film region of this thin film by photolithography. This resist pattern is used as a mask to selectively remove the thin film by dry etching or wet etching. To form a very thin film having a thickness of 0.01 to 0.05 $\mu$m, however, the conductor pattern can be formed by etching back the thin film by CMP.

(Second Step)

Subsequently, CVD of copper is performed to selectively deposit a copper film on the conductor pattern of the undercoat film.

A source gas of this CVD of copper can be the same as used in the copper selective formation methods described above. This source gas can be diluted by a carrier gas such as nitrogen.

In this CVD of copper, the source gas of copper described above is desirably decomposed by adsorption by setting the ambient temperature (e.g., the substrate temperature) of the substrate to preferably 220° C. or less, and more preferably, 150 to 200° C.

In this copper film selective formation method according to the present invention, after the formation of the conductor pattern and before the CVD of copper it is possible to form a thin film of silane coupling agent or a surfactant on the entire surface and selectively irradiate the thin film corresponding to the conductor pattern with ultraviolet light (UV light).

Examples of the silane coupling agent are hexamethyldisilazane, vinyltrichlorosilane, vinyltrimethoxysilane, vinyltriethoxysilane, vinyltris ($\beta$ methoxyethoxy)silane, $\gamma$-glycidoxypropyltrimethoxysilane, $\gamma$-methacryloxypropylmethyldimethoxysilane, N-$\beta$ (aminoethyl) $\gamma$-aminopropylmethyldimethoxysilane, $\gamma$-mercaptopropyltrimethoxysilane, $\gamma$-aminopropyltriethoxysilane, and bis(3-triethoxysilylpropyl)tetrasulfane.

As the surfactant, long-chain alkylsulfonic acid, long-chain alkylcarboxylic acid, or the like can be used.

The thin film made from the silane coupling agent or the surfactant described above is formed by, e.g., vapor adsorption or coating. This thin film preferably has a molecular-level thickness since it is made hydrophilic by UV irradiation (to be described later).

When the wavelength of the UV light is 365 nm, the film is preferably selectively irradiated with the UV light at an output of 300 mJ/cm$^2$ or more.

Also, in this copper film selective formation method according to the present invention, after the formation of the conductor pattern and before the CVD of copper, a photosensitive resin layer having a hole in a region corresponding to the conductor pattern can be formed on the surface of the undercoat film including the conductor pattern.

As this photosensitive resin, either a positive type or negative type resin can be used. Practical examples are a cresol novolak resist and an acrylic resin-based resist.

The thickness of the photosensitive resin layer is preferably 0.3 $\mu$m or more, and more preferably, 0.7 to 1.5 $\mu$m, in order to improve the separation between the undercoat and a Cu film formed by depositing Cu on the photosensitive resin layer by CVD (to be described later).

In this copper film selective formation method according to the present invention as described above, a conductor pattern made of a material other than copper and having higher conductivity than that of an undercoat film on a substrate is formed in a prospective copper film region on the surface of the undercoat film. This produces a difference in exchange (principally adsorptive decomposition) of electric charge with a source gas (to be described later) of copper between the conductor pattern and the other region of the undercoat film. That is, the conductor pattern facilitates exchange (primarily adsorptive decomposition) of electric charge with a source gas of copper, compared to the other region of the undercoat film. In this state, CVD of copper is performed at a low temperature of 150 to 220° C. As described above, this CVD is performed by adsorptive decomposition of a source gas of copper. Hence, copper can be selectively deposited on the conductor pattern (prospective copper film region). Consequently, a copper film (copper pattern) such as a copper interconnection can be selectively formed in a desired region of the undercoat film without wasting copper unlike in etching or CMP.

Additionally, after the formation of the conductor pattern and before the CVD of copper, a thin film of a silane coupling agent or a surfactant can be formed on the surface of the undercoat film including the conductor pattern to make this surface hydrophobic. A portion where the conductor pattern is positioned of this hydrophobic thin film is selectively irradiated with UV light to make this irradiated region hydrophilic. When in this state the CVD of copper (adsorptive decomposition of a source gas of copper) is performed at a low temperature of 150 to 220° C., the copper can be deposited with higher selectively on the conductor pattern (prospective copper film region) on which the hydrophilic thin film exists.

Furthermore, after the formation of the conductor pattern and before the CVD of copper, a photosensitive resin layer having a hole in a region corresponding to the conductor pattern can be formed on the surface of the undercoat including the conductor pattern, thereby producing a hydrophilic/hydrophobic difference between the conductor pattern exposed in the hole and the photosensitive resin layer. When in this state the CVD of copper (adsorptive decomposition of a source gas of copper) is performed at a low temperature of 150 to 220° C., the copper can be deposited with higher selectively on the highly hydrophilic conductor pattern (prospective copper film region). The photosensitive resin layer is removed after the selective deposition of copper.

Preferred examples of the present invention, e.g., examples of the fabrication of a TFT-LCD array substrate will be described below with reference to the accompanying drawings.

EXAMPLE 1

Figure 4A:
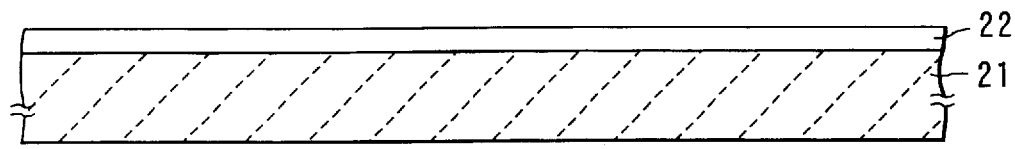
FIGS. 4A, 4B, 4C, 4D, 4E, 4F, 4G, 4H and 4I are sectional views showing the fabrication steps of an array substrate having TFTs according to Example 1 of the present invention.
Figure 4B:
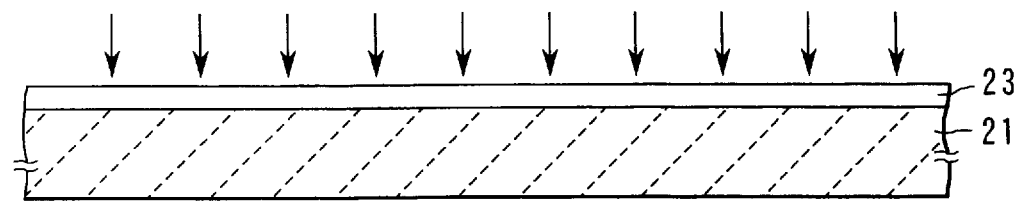

First, as shown in FIG. 4A, on a 500 mm×600 mm glass substrate 21 coated with an $SiO_2$ film (not shown) for preventing contamination, a 50 nm thick amorphous silicon (a-Si) film 22 was deposited at a substrate temperature of 420° C. by low-pressure CVD. Note that a silicon nitride ($SiN_x$) film or a film of a mixture of silicon nitride and silicon oxide or a multiple film of these oxides can also be used instead of an $SiO_2$ film. As shown in FIG. 4B, the a-Si film 22 was doped with an impurity (e.g., boron) to control the threshold of a TFT. Subsequently, this boron-doped a-Si film was crystallized by excimer laser annealing to form a thin boron-doped polysilicon (p-Si) film 23. Note that, when the substrate is made of a high heat-resistance glass such as a quart, lamp annealing can also be performed instead of excimer laser annealing. In addition, if a TFT having a-Si active layer is fabricated, it is possible to anneal to 600° C. or less without polycrystallizing.

Figure 4C:
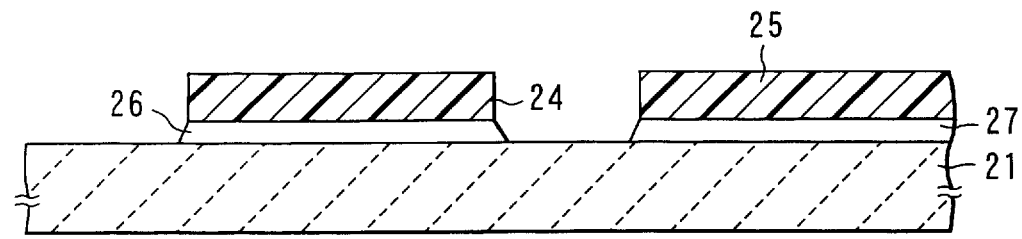

The surface of this thin p-Si film 23 was coated with a resist by spin coating. This resist was dried, exposed, and developed to form resist patterns 24 and 25. These resist patterns 24 and 25 were used as masks to selectively remove the thin p-Si film 23 by CDE (Chemical Dry Etching) using $CF_4$ and $O_2$ gases, forming thin island-like p-Si films 26 and 27 shown in FIG. 4C.

Figure 4D:
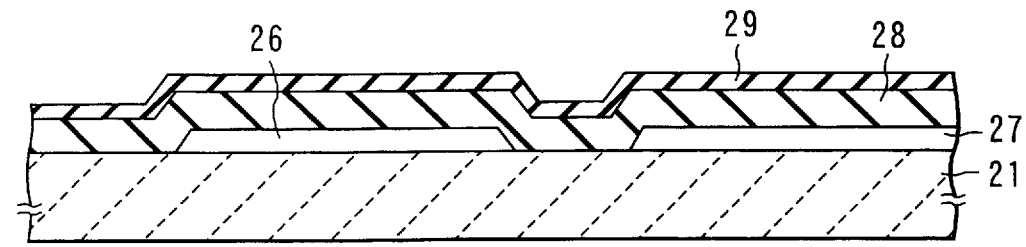
Figure 4E:
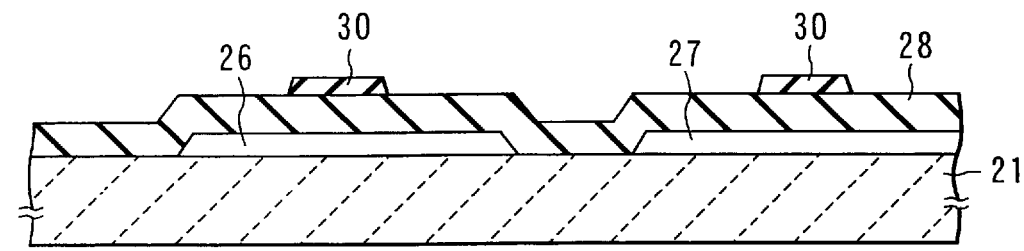

After the resist patterns were removed by ashing, as shown in FIG. 4D, a 200 nm thick $SiO_2$ film 28 as an undercoat film was deposited on the glass substrate 21 including the thin island-like p-Si films 26 and 27 by low-pressure CVD using TEOS as a source gas. Additionally, a 50 nm thick silicon nitride ($SiN_x$) film 29 was deposited on this thin $SiO_2$ film 28 by low-pressure CVD. Subsequently, the surface of the thin silicon nitride film 29 was coated with a resist by spin coating, and this resist was dried, exposed, and developed to form resist patterns (not shown). These resist patterns were used as masks to selectively etch away the thin silicon nitride film 29. The resist patterns were then removed to form silicon nitride diffusion barrier films 30 shown in FIG. 4E.

Figure 4F:
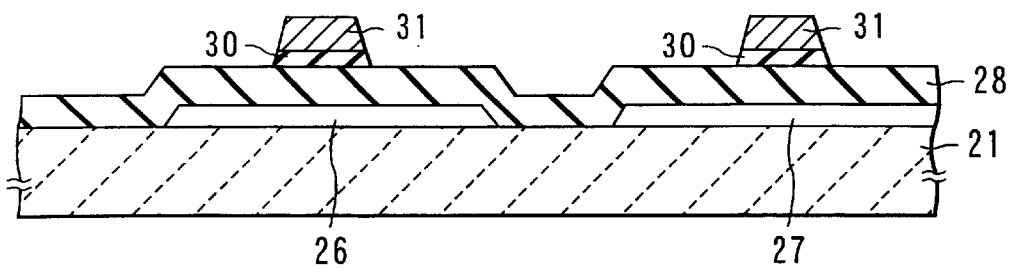

The thin SiO film 28 including these diffusion barrier films 30 was allowed to adsorb saturated vapor of hexamethylsilazane as a silane coupling agent at room temperature (25° C.) for about 5 min. Those surfaces of the diffusion barrier films 30 on which the silane coupling agent was adsorbed were selectively irradiated with 365 nm UV light at an output of 1,500 $mJ/cm^2$, thereby optically decomposing the silane coupling agent. Subsequently, trimethylvinylsilane-added hexafluoroacetylacenate copper as a source gas of copper was used to deposit a Cu film on the diffusion barrier films 30 by selective CVD at a substrate temperature of 200° C. and a source gas pressure of 1 torr. After that, annealing was performed to form Cu gate electrodes 31 as shown in FIG. 4F. This annealing is performed to remove the moisture adsorbed in the CVD step, but the process can also be omitted.

Figure 4G:
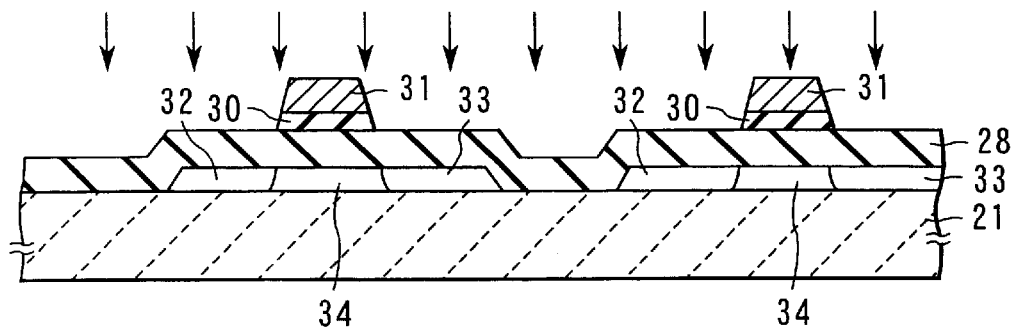

Subsequently, the gate electrodes 31 were tested. That is, the resistance value of the Cu film and the presence/absence of a disconnection of the film were electrically tested, and the gate electrodes 31 was tested for any disconnection or short circuit by comparing the contours of these gate electrodes 31 with a prestored pattern. A substrate found to be a good product by these tests was chosen, and the gate electrodes 31 and the underlying diffusion barrier films 30 were used as masks to selectively dope the thin island-like p-Si films 26 and 27 with an impurity, e.g., phosphorus. Consequently, as shown in FIG. 4G, $n^+$-type source and drain regions 32 and 33 and a p-type channel region 34 were formed in each of the thin island-like p-Si films 26 and 27.

Figure 4H:
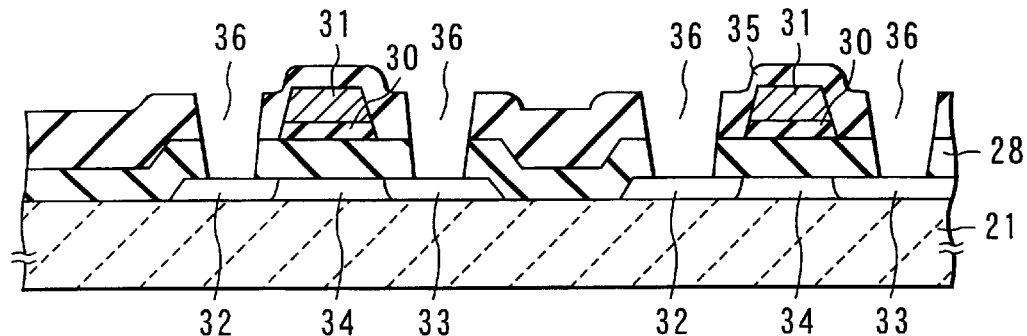
Figure 4I:
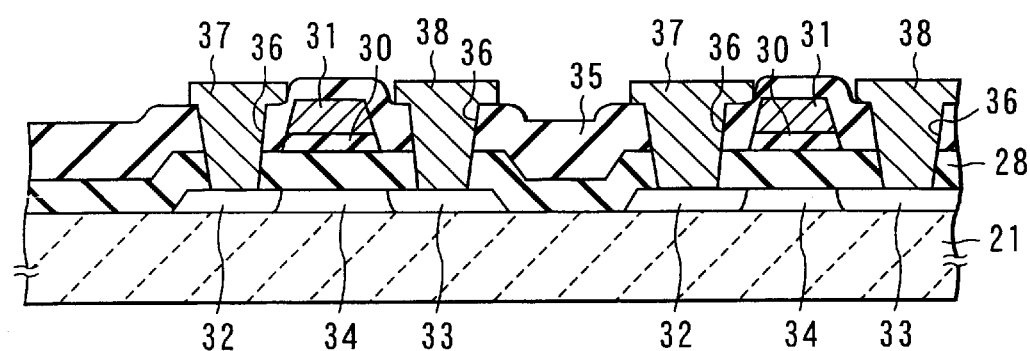

A silicon nitride ($SiN_x$) film 35 as an insulating interlayer was then deposited on the entire surface by low-pressure CVD. Note that silicon oxide ($SiO_2$) film can also be used instead of a silicon nitride film. Resist patterns (not shown) were formed on this silicon nitride ($SiN_x$) film 35 and used as masks to selectively wet-etch the silicon nitride ($SiN_x$) film 35 and the thin SiO film 28. By this step, as shown in FIG. 4H, contact holes 36 reaching the source and drain regions 32 and 33 were formed. Subsequently, an Al—Nd alloy film for source and drain electrode interconnections was deposited by sputtering on the silicon nitride ($SiN_x$) film 35 including these contact holes 36. After that, resist patterns (not shown) were formed on this Al—Nd alloy film and used as masks to selectively etch away the Al—Nd alloy film. Consequently, as shown in FIG. 4I, a source electrode interconnection 37 connected to the source region 32 through the contact hole 36 and a drain electrode interconnection 38 connected to the drain region 33 through the contact hole 36 were formed. In this manner, an array substrate having a plurality of TFTs was fabricated.

In Example 1 as described above, it was possible to fabricate an array substrate having gate electrodes formed by the Cu selective deposition technique with small Cu consumption.

Note that in Example 1 the source and drain electrode interconnections were formed by sputtering vapor deposition and patterning of an Al—Nd alloy film. However, these interconnections can also be formed by a Cu film selective deposition technique substantially identical with the formation of the Cu gate electrodes.

EXAMPLE 2

Figure 5A:
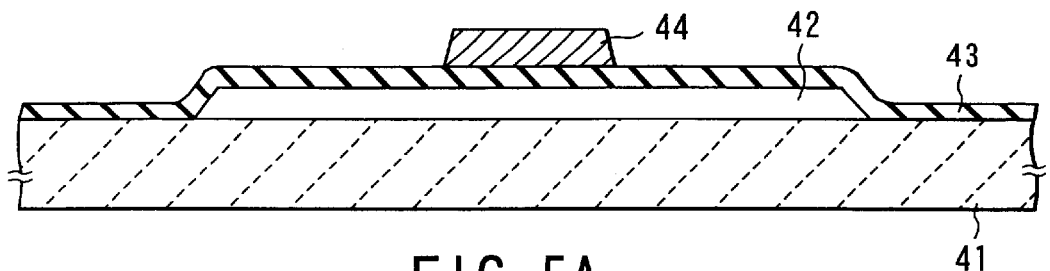
FIGS. 5A, 5B, 5C, 5D, 5E, 5F and 5G are sectional views showing the fabrication steps of an array substrate having TFTs according to Example 2 of the present invention.

First, on a 500 mm×600 mm glass substrate 41 coated with an $SiO_2$ film (not shown) for preventing contamination, a 50 nm thick amorphous silicon (a-Si) film was deposited at a substrate temperature of 420° C. by low-pressure CVD. Note that a silicon nitride ($SiN_x$) film or a film of a mixture of silicon nitride and silicon oxide or a multiple film of these oxides can also be used instead of an $SiO_2$ film. This a-Si film was doped with an impurity (e.g., boron) to control the threshold of a TFT. Subsequently, this boron-doped a-Si film was crystallized by excimer laser annealing to form a thin boron-doped polysilicon (p-Si) film. Note that, when the substrate is made of a high heat-resistant glass such as a quart, lamp annealing can also be performed instead of excimer laser annealing. In addition, if a TFT having a-Si active layer is fabricated, it is possible to anneal at 600° C.

or less without polycrystallizing. The surface of this thin p-Si film was coated with a resist by spin coating. This resist was dried, exposed, and developed to form a resist pattern (not shown). This resist pattern was used as a mask to selectively remove the thin p-Si film by CDE (Chemical Dry Etching) using $CF_4$ and $O_2$ gases, forming a thin island-like p-Si film 42. After the resist pattern was removed by ashing, a 200 nm thick $SiO_2$ film 43 as a gate insulating film was deposited on the glass substrate 41 including the thin island-like p-Si film 42 by low-pressure CVD using TEOS as a source gas. Subsequently, aluminum was vapor-deposited on this thin $SiO_2$ film 43 and selectively etched using a resist pattern (not shown) as a mask, thereby forming a gate electrode 44 as shown in FIG. 5A.

Figure 5B:
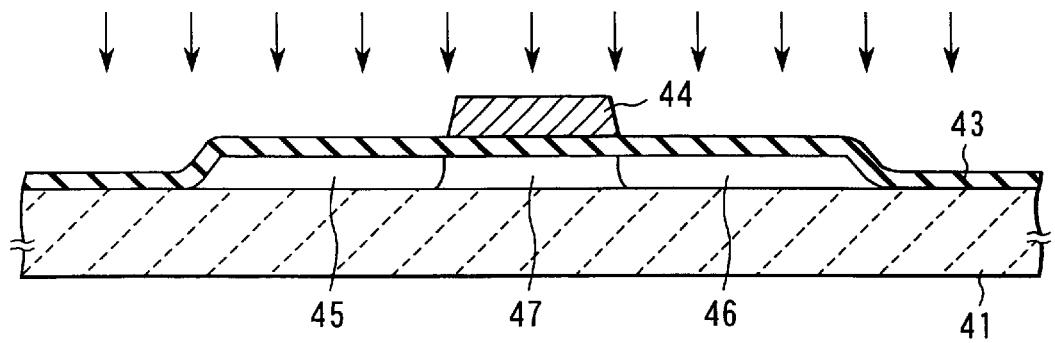

As shown in FIG. 5B, this gate electrode 44 was used as a mask to selectively dope the thin island-like p-Si film 42 with an impurity, e.g., phosphorus, forming $n^+$-type source and drain regions 45 and 46 and a p-type channel region 47 in this thin island-like p-Si film 42.

Figure 5C:
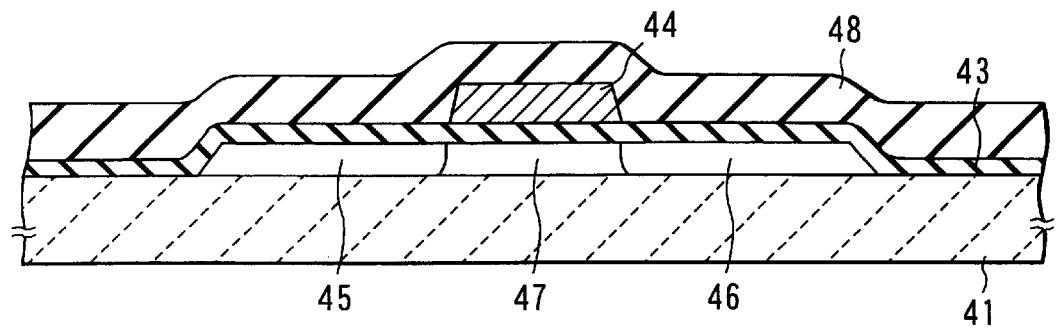
Figure 5D:
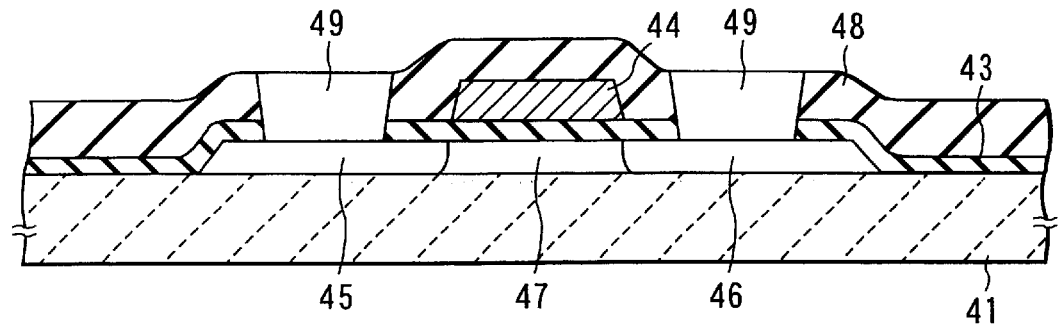

As shown in FIG. 5C, a silicon nitride ($SiN_x$) film 48 as an insulating interlayer was then deposited on the entire surface by low-pressure CVD. Resist patterns (not shown) were formed on this silicon nitride ($SiN_x$) film 48 and used as masks to selectively wet-etch the silicon nitride ($SiN_x$) film 48 and the thin $SiO_2$ film 43. Consequently, as shown in FIG. 5D, contact holes 49 reaching the source and drain regions 45 and 46 were formed.

Figure 5E:
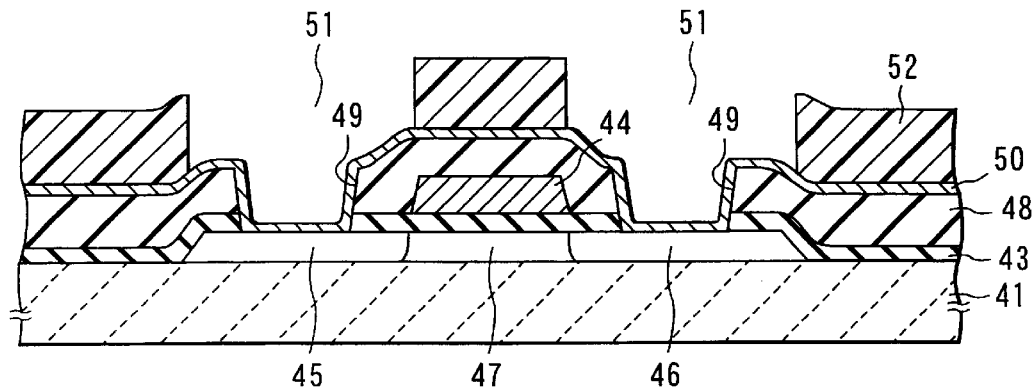

As shown in FIG. 5E, a 30 nm thick TiN film 50 as an undercoat film was formed on the inner surfaces of the contact holes 49 and on the silicon nitride film 48 by reactive sputtering in an $Ar/N_2$ atmosphere. This TiN film 50 was coated with a positive cresol novolak resist by spin coating, and the resist was dried, exposed, and developed. By this processing, a 1.0 µm thick resist layer 52 having openings 51 in those regions of the TiN film 50, which corresponded to the contact holes 49 and their peripheral portions, was formed.

Figure 5F:
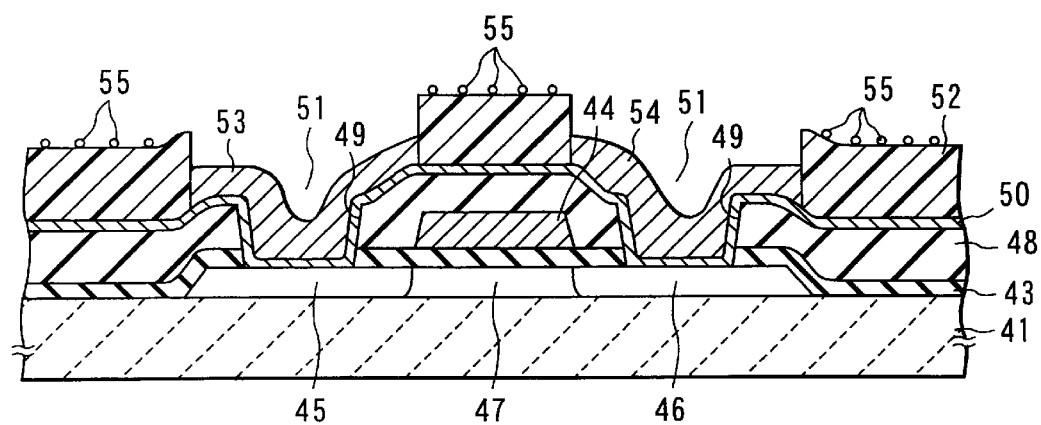
Figure 5G:
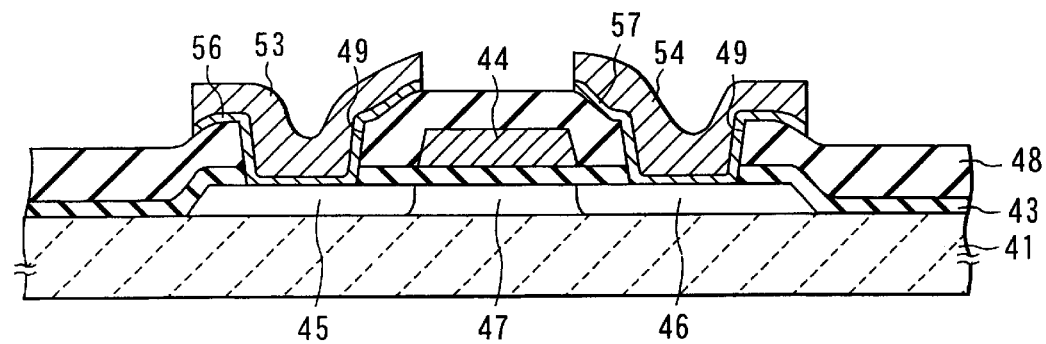

Subsequently, trimethylvinylsilane-added hexafluoro-acetylacenate copper as a source gas of copper was used to perform selective CVD at a substrate temperature of 170° C. and a source gas pressure of 2 torr. Consequently, as shown in FIG. 5F, copper was primarily deposited in the contact holes 49 exposed in the openings 51 in the resist layer 52 and on those portions of the TiN film 50, which were formed on the silicon nitride film 48 around these contact holes 49, thereby forming a source interconnection 53 and a drain interconnection 54. At the same time, a slight amount of copper particles 55 were also deposited on the resist layer 52. This resist layer 52 on the surface of which the copper particles 55 were deposited was removed by an organic solvent. Additionally, the interconnections 53 and 54 were used as masks to selectively remove the exposed portions of the TiN film 50 by chemical dry etching using a $CF_4/O_2$ plasma. As a consequence, TiN copper diffusion preventing layers 56 and 57 having the same dimensions as the interconnections 53 and 54 were formed below these interconnections 53 and 54, respectively. In this way, an array substrate having a TFT shown in FIG. 5G was fabricated.

In Example 2 as described above, it was possible to fabricate an array substrate having source and drain interconnections 53 and 54 formed by the Cu selective deposition technique with small Cu consumption.

Also, the TiN copper diffusion preventing layers 56 and 57 having the same dimensions as the interconnections 53 and 54 made of copper were formed below these interconnections 53 and 54, respectively. It was therefore possible by these copper diffusion preventing layers 56 and 57 to prevent copper of the interconnections 53 and 54 from diffusing into the source and drain regions 45 and 46 through the contact holes 49 and thereby contaminating these regions. Accordingly, a highly reliable array substrate was fabricated.

EXAMPLE 3

Figure 6A:
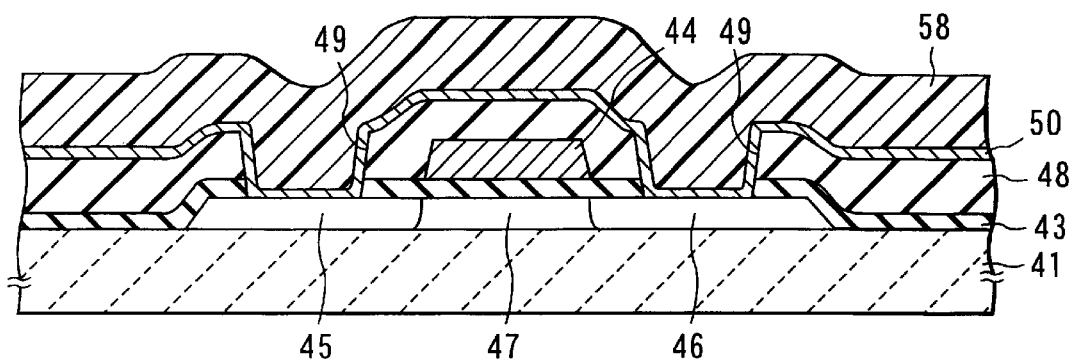
FIGS. 6A, 6B and 6C are sectional views showing the fabrication steps of an array substrate having TFTs according to Example 3 of the present invention.

Following the same procedures as in Example 2 above, contact holes 49 were formed in a silicon nitride film 48. After that, as shown in FIG. 6A, a 30 nm thick TiN film 50 as an undercoat film was formed on the inner surfaces of the contact holes 49 and on the silicon nitride film 48 by reactive sputtering in an $Ar/N_2$ atmosphere. This TiN film 50 was coated with a positive cresol novolak resist by spin coating, and the resist was dried to form a 1.0 µm thick resist layer 58.

Figure 6B:
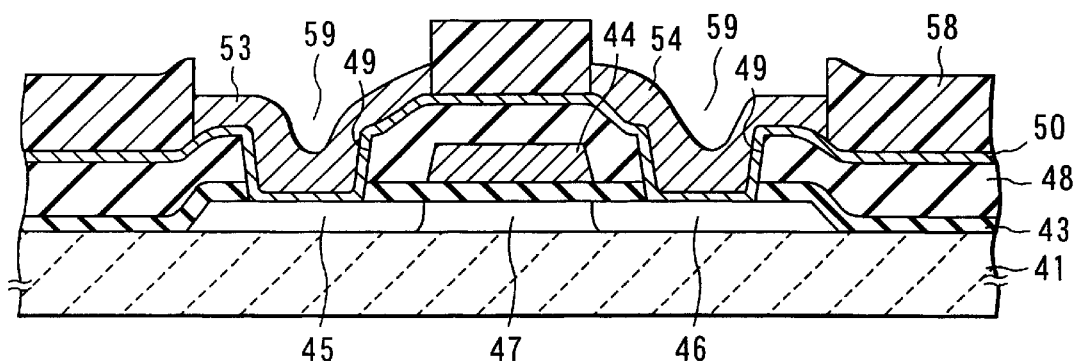
Figure 6C:
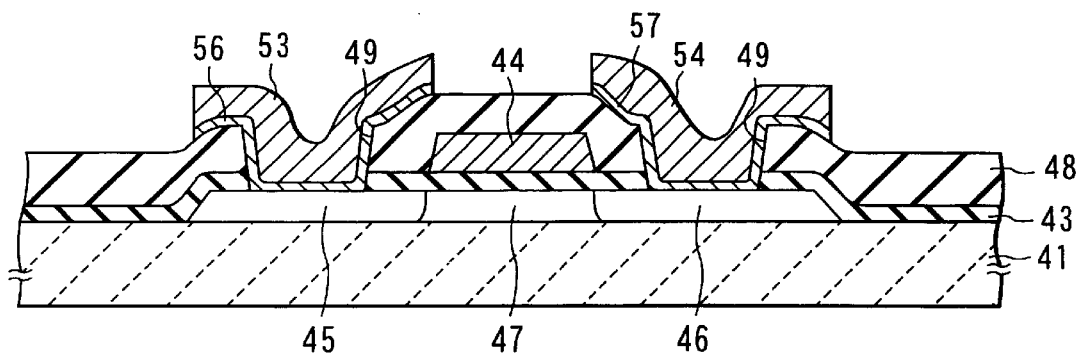

This resist layer was exposed and developed to form openings 59 in those regions of the resist layer 58, which corresponded to the contact holes 49 and their peripheral portions. Subsequently, the resultant substrate was exposed to a plasma of $CF_4/O_2$ gas mixture containing 95 vol % of $O_2$. After that, trimethylvinylsilane-added hexafluoroacety-lacenate copper as a source gas of copper was used to perform selective CVD at a substrate temperature of 180° C. and a source gas pressure of 1 torr. Consequently, as shown in FIG. 6B, copper was deposited only in the contact holes 49 exposed in the openings 59 in the resist layer 58 and on those portions of the TiN film 50, which were formed on the silicon nitride film 48 around these contact holes 49, thereby forming a source interconnection 53 and a drain interconnection 54. The resist layer 58 was removed by an organic solvent, and the interconnections 53 and 54 were used as masks to selectively remove the exposed portions of the TiN film 50 by chemical dry etching using a $CF_4/O_2$ plasma. As a consequence, TiN copper diffusion preventing layers 56 and 57 having the same dimensions as the interconnections 53 and 54 were formed below these interconnections 53 and 54, respectively. In this manner, an array substrate having a TFT shown in FIG. 6C was fabricated.

In Example 3 as described above, it was possible to fabricate an array substrate having source and drain interconnections 53 and 54 formed by the Cu selective deposition technique with small Cu consumption.

Also, the TiN copper diffusion preventing layers 56 and 57 having the same dimensions as the interconnections 53 and 54 made of copper were formed below these interconnections 53 and 54, respectively. It was therefore possible by these copper diffusion preventing layers 56 and 57 to prevent copper of the interconnections 53 and 54 from diffusing into the source and drain regions 45 and 46 through the contact holes 49 and thereby contaminating these regions. Accordingly, a highly reliable array substrate was fabricated.

EXAMPLE 4

Figure 7A:
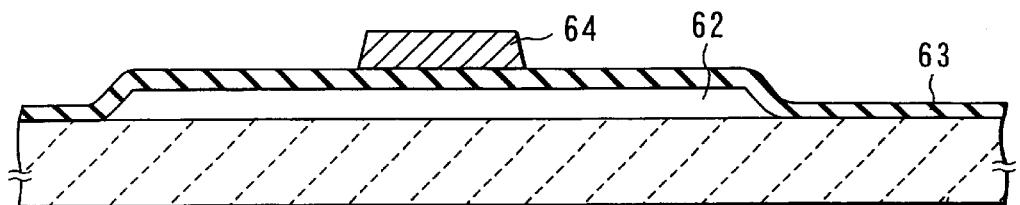
FIGS. 7A, 7B, 7C, 7D, 7E, 7F and 7G are sectional views showing the fabrication steps of an array substrate having TFTs according to Example 4 of the present invention.

First, on a 500 mm×600 mm glass substrate 61 coated with an $SiO_2$ film (not shown) for preventing contamination, a 50 nm thick amorphous silicon (a-Si) film was deposited at a substrate temperature of 420° C. by low-pressure CVD. Note that a silicon nitride ($SiN_x$) film or a film of a mixture of silicon nitride and silicon oxide or a multiple film of these oxides can also be used instead of an $SiO_2$ film. This a-Si film was doped with an impurity (e.g., boron) to control the threshold of a TFT. Subsequently, this boron-doped a-Si film was crystallized by excimer laser annealing to form a thin boron-doped polysilicon (p-Si) film. Note that, when the substrate is made of a high heat-resistant glass such as a quart, lamp annealing can also be performed instead of excimer laser annealing. In addition, if a TFT having a-Si active layer is fabricated, it is possible to anneal at 600° C. or less without polycrystallizing. The surface of this thin p-Si film was coated with a resist by spin coating. This resist was dried, exposed, and developed to form a resist pattern (not shown). This resist pattern was used as a mask to selectively remove the thin p-Si film by CDE (Chemical Dry Etching) using $CF_4$ and $O_2$ gases, forming a thin island-like p-Si film 62. After the resist pattern was removed by ashing, a 200 nm thick $SiO_2$ film 63 as a gate insulating film was deposited on the glass substrate 61 including the thin island-like p-Si film 62 by low-pressure CVD using TEOS as a source gas. Subsequently, aluminum was vapordeposited on this thin $SiO_2$ film 63 and selectively etched using a resist pattern (not shown) as a mask, thereby forming a gate electrode 64 as shown in FIG. 7A.

Figure 7B:
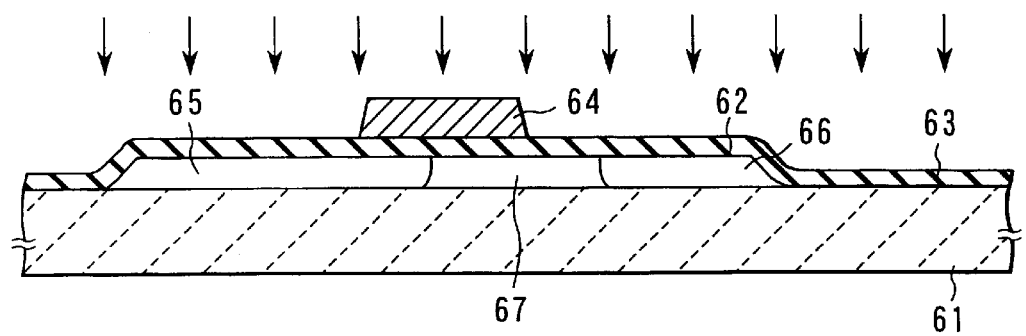

As shown in FIG. 7B, this gate electrode 64 was used as a mask to selectively dope the thin island-like p-Si film 62 with an impurity, e.g., phosphorus, forming $n^+$-type source and drain regions 65 and 66 and a p-type channel region 67 in this thin island-like p-Si film 62.

Figure 7C:
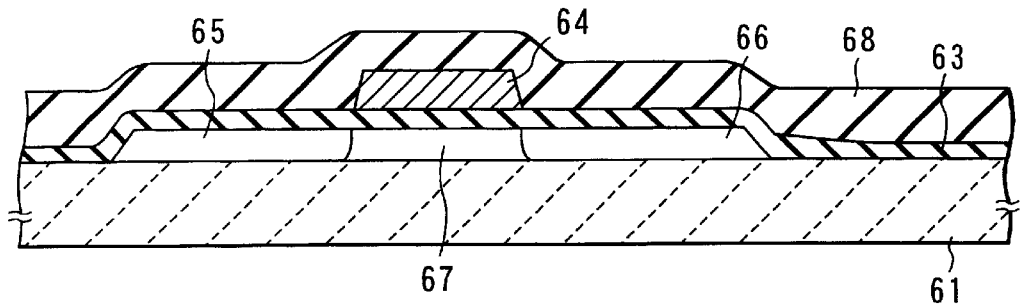
Figure 7D:
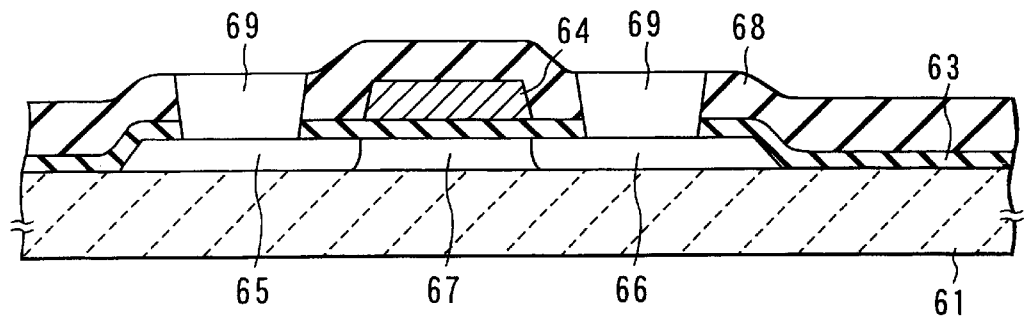

As shown in FIG. 7C, a silicon nitride ($SiN_x$) film 68 as an insulating interlayer was then deposited on the entire surface by low-pressure CVD. Resist patterns (not shown) were formed on this silicon nitride film 68 and used as masks to selectively wet-etch the silicon nitride film 68 and the thin $SiO_2$ film 63. Consequently, as shown in FIG. 7D, contact holes 69 reaching the source and drain regions 65 and 66 were formed.

Figure 7E:
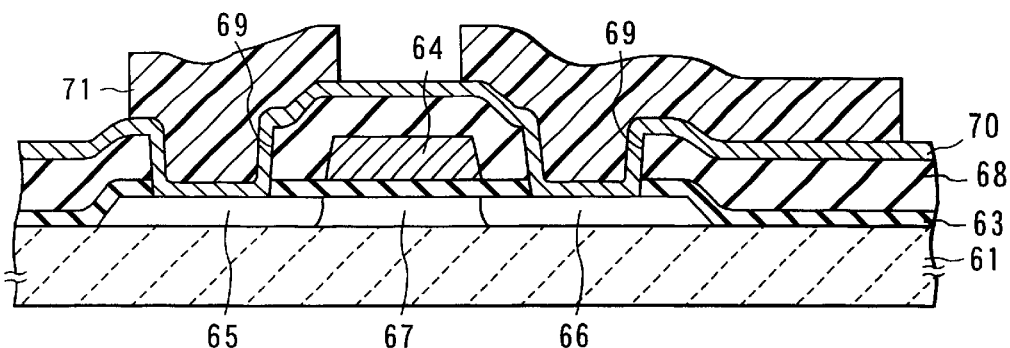
Figure 7F:
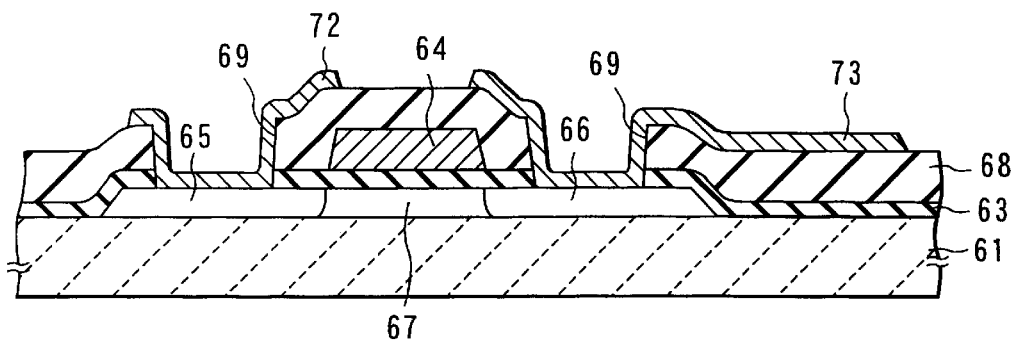

A 0.05 μm thick Ti film 70 was then deposited on the entire surface by vacuum vapor deposition. This thin Ti film 70 was coated with a resist by spin coating, and the resist was dried, exposed, and developed to form a resist pattern 71 as shown in FIG. 7E. This resist pattern 71 was used as a mask to selectively etch away the thin Ti film 70. Consequently, as shown in FIG. 7F, Ti patterns 72 and 73 were formed in the contact holes 69 and their peripheral portions. After that, the resist pattern 71 was removed by ashing.

Figure 7G:
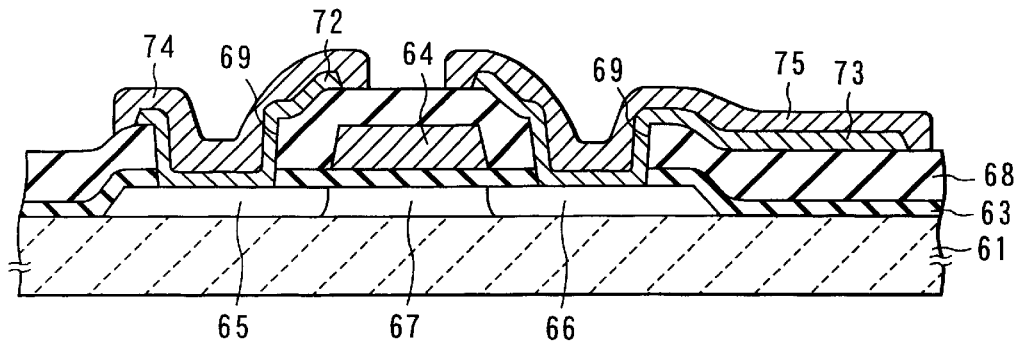

Subsequently, trimethylvinylsilane-added hexafluoroacetylacenate copper as a source gas of copper was used to perform selective CVD at a substrate temperature of 180° C. and a source gas pressure of 1 torr. Consequently, as shown in FIG. 7G, copper was selectively deposited on the Ti patterns 72 and 73 to form a source interconnection 74 and a drain interconnection 75, each made of Cu, on the Ti patterns 72 and 73, respectively, which were connected to the source and drain regions 65 and 66 through the contact holes 69. In this way, an array substrate having a TFT was fabricated.

In Example 4 as described above, it was possible to fabricate an array substrate having source and drain interconnections 74 and 75 formed by the Cu selective deposition technique with small Cu consumption.

Also, the Ti patterns 72 and 73 capable of preventing copper diffusion were formed below the copper interconnections 74 and 75, respectively. It was therefore possible by these Ti patterns 72 and 73 to prevent copper of the interconnections 74 and 75 from diffusing into the source and drain regions 65 and 66 through the contact holes 69 and thereby contaminating these regions. Accordingly, a highly reliable array substrate was fabricated.

EXAMPLE 5

Figure 8:
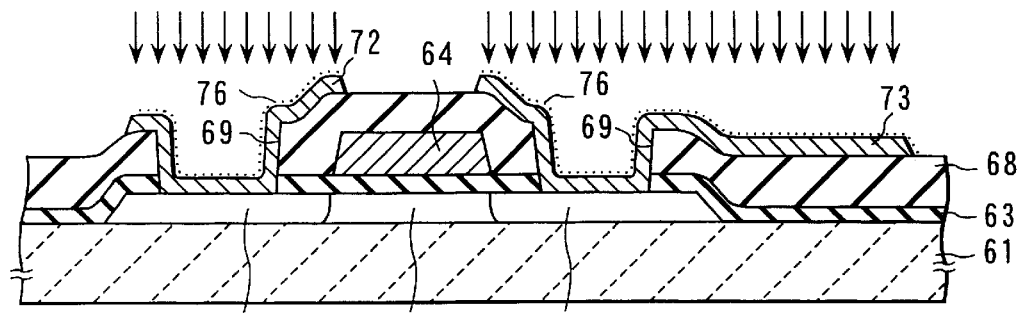
FIG. 8 is a sectional view showing the fabrication step of an array substrate having TFTs according to Example 5 of the present invention.

Ti patterns 72 and 73 were formed following the same procedures as in Example 4. After that, a silicon nitride film 68 including these Ti patterns 72 and 73 was allowed to adsorb saturated vapor of hexamethyldisilazane as a silane coupling agent at room temperature (25° C.) for about 5 min. Subsequently, the thin film of the silane coupling agent formed on the Ti patterns 72 and 73 was selectively irradiated with 365 nm UV light at an output of 1,500 mJ/cm$^2$ to optically decompose the silane coupling agent. Consequently, as shown in FIG. 8, a hydrophilic portion 76 was formed on the Ti patterns 72 and 73. After that, following the same procedure as in Example 4, trimethylvinylsilane-added hexafluoroacetylacenate copper as a source gas of copper was used to perform selective CVD at a substrate temperature 180° C. and a source gas pressure of 1 torr. As a consequence, Cu was selectively deposited on the Ti patterns to form source and drain interconnections made of Cu. In this manner, an array substrate having a TFT was fabricated.

The obtained array substrate had Cu source and drain interconnections faithful to the Ti patterns.

EXAMPLE 6

Figure 9A:
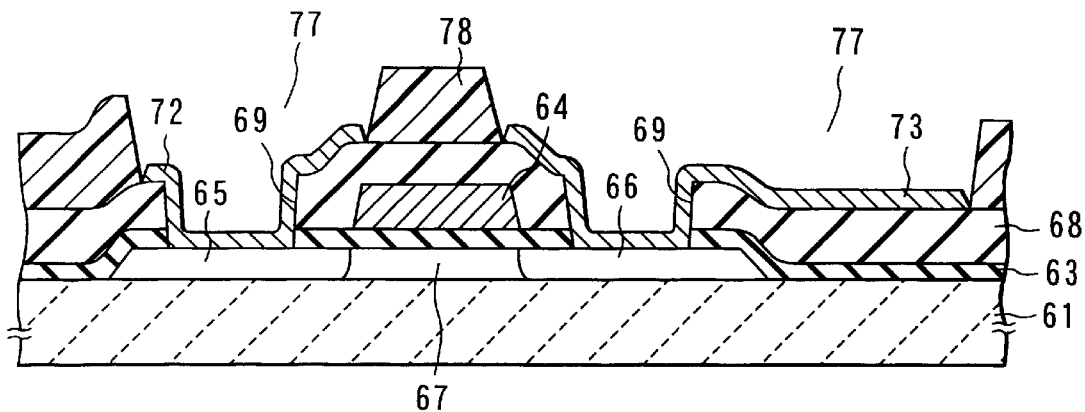
FIGS. 9A, 9B and 9C are sectional views showing the fabrication steps of an array substrate having TFTS according to Example 6 of the present invention.
Figure 9B:
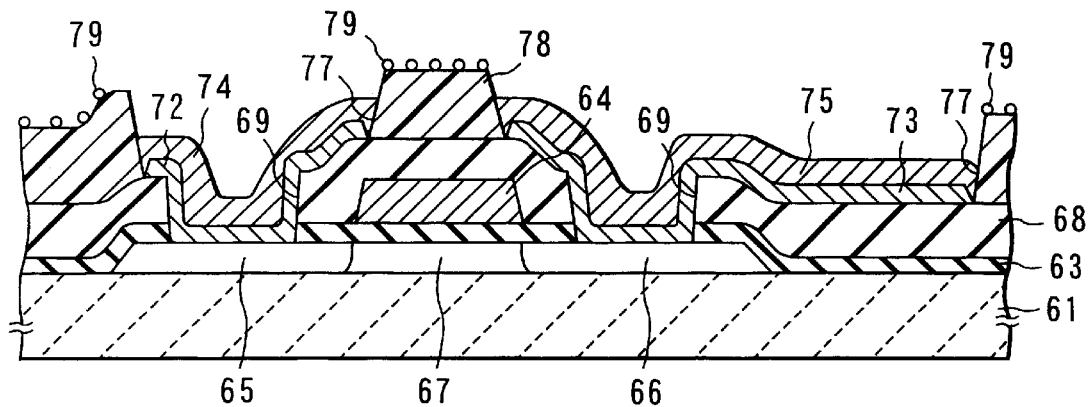
Figure 9C:
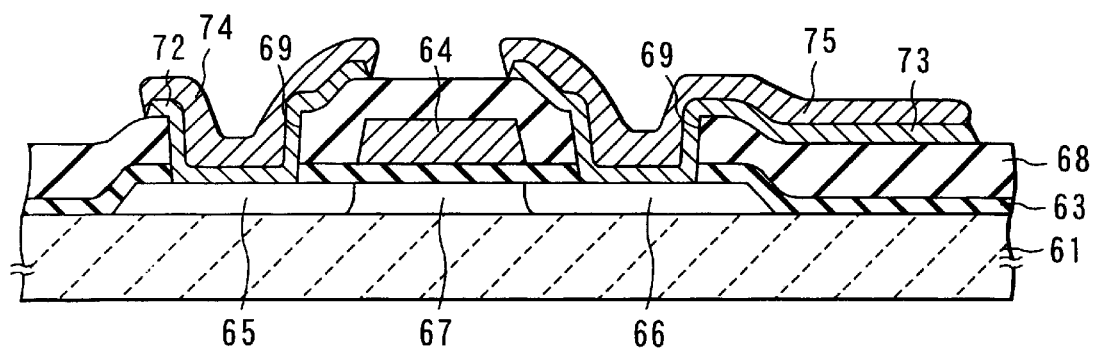

Ti patterns 72 and 73 were formed following the same procedures as in Example 4. After that, a silicon nitride film 68 including these Ti patterns 72 and 73 was coated with a positive cresol novolak resist by spin coating. This resist was dried, exposed, and developed to form a 1.0 μm thick resist layer 78 having openings 77 in regions corresponding to the Ti patterns 72 and 73 as shown in FIG. 9A. Subsequently, trimethylvinylsilane-added hexafluoroacetylacenate copper as a source gas of copper was used to perform selective CVD at a substrate temperature of 200° C. and a source gas pressure of 1 torr. Consequently, as shown in FIG. 9B, Cu was primarily deposited on the Ti patterns 72 and 73 exposed in the openings 71 in the resist layer 78 to form a source interconnection 74 and a drain interconnection 75. At the same time, a slight amount of particulate Cu 79 was also deposited on the resist layer 78. This resist layer 78 on the surface of which the particulate Cu 79 was deposited was removed by an organic solvent. In this way, an array substrate having a TFT shown in FIG. 9C was fabricated.

The obtained array substrate had the Cu source and drain interconnections 74 and 75 faithful to the Ti patterns 72 and 73, respectively.

In the Examples described above, all transistors provided on the glass substrate are n-channel transistors. Nonetheless, the n-channel transistors may be replaced by p-channel transistors in the present invention. Moreover, the invention is useful when applied to so-called CMOS circuits, each having n-channel transistors and p-channel transistors on the same substrate.

In Examples 4 to 6, Ti patterns were used as conductor patterns. However, similar selective deposition of copper could be performed even with the use of other metals or amorphous silicon or polysilicon containing $5 \times 10^{18}$ particles/cm$^2$ or more of an n- or p-type dopant.

As has been described above, the present invention can provide a copper film selective formation method capable of reducing the material cost by selectively depositing copper in a necessary region of an undercoat film made of an arbitrary material such as a metal or an insulator, and capable of forming a copper film effective as a low-resistance interconnection in an LSI or a liquid crystal display.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A copper film selective formation method comprising the steps of:

forming a thin film of one of a silane coupling agent and a surfactant on an undercoat film on a substrate;

making a prospective copper film region of said thin film hydrophilic; and selectively forming a copper film in the hydrophilic prospective copper film region of said undercoat film by CVD of copper.

2. The method according to claim 1, wherein said step of making the prospective copper film region of said thin film hydrophilic comprises selectively irradiating the prospective copper film region of said thin film with ultraviolet light.

3. The method according to claim 1, wherein said CVD of copper is performed by setting a substrate temperature to not more than 220° C.

4. A copper film selective formation method comprising:

forming an undercoat film on a substrate;

forming a conductor pattern on the surface of an undercoat film, the conductor pattern being made of a material other than copper and having higher conductivity than said undercoat film, and selectively depositing a copper film on said conductor pattern by CVD of copper, wherein after said conductor pattern has been formed and before said CVD of copper is performed, a thin film of one of a silane coupling agent and a surfactant is formed on an entire surface, and said thin film corresponding to said conductor pattern is selectively irradiated with ultraviolet light.

5. The method of claim 4, wherein said conductor pattern is made of a material selected from the group consisting of Ti, W, Mo, To, Al, and alloys thereof.

6. The method of claim 4, wherein said CVD of copper is performed by setting a substrate temperature to not more than 220° C.

\* \* \* \* \*